United States Patent [19]

Katayama et al.

[11] Patent Number: 5,001,032

[45] Date of Patent: Mar. 19, 1991

[54] PHOTOSENSITIVE MATERIAL CONTAINING A PHOTOSENSITIVE AND HEAT DEVELOPABLE ELEMENT AND A POLYMERIZABLE LAYER AND IMAGE-FORMING METHOD UTILIZING THE SAME

[75] Inventors: Masato Katayama, Yokohama; Tetsuro Fukui; Kozo Arahara, both of Kawasaki; Yoshio Takasu, Tama; Kenji Kagami, Atsugi, all of Japan

[73] Assignee: Canon Kabushiki Kaisha, Tokyo, Japan

[21] Appl. No.: 453,162

[22] Filed: Dec. 19, 1989

Related U.S. Application Data

[63] Continuation of Ser. No. 307,273, Feb. 7, 1989, abandoned.

[30] Foreign Application Priority Data

Feb. 8, 1988 [JP] Japan ................................ 63-25749

[51] Int. Cl.[5] ......................... G03C 8/02; G03C 1/06

[52] U.S. Cl. .................................... 430/203; 430/213; 430/254; 430/619

[58] Field of Search ................ 430/203, 213, 254, 619

[56] References Cited

U.S. PATENT DOCUMENTS

| | | | |
|---|---|---|---|
| 3,874,947 | 4/1975 | Hayakawa et al. . | |
| 4,287,290 | 9/1981 | Mizuno et al. | 430/205 |
| 4,624,910 | 11/1986 | Takeda | 430/203 |
| 4,629,676 | 12/1986 | Hayakawa et al. | 430/203 |
| 4,649,098 | 3/1987 | Takeda | 430/270 |
| 4,758,496 | 7/1988 | Kakimi | 430/138 |

FOREIGN PATENT DOCUMENTS

| | | |
|---|---|---|
| 202490 | 11/1986 | European Pat. Off. . |
| 232721 | 8/1987 | European Pat. Off. . |
| 3207064 | 12/1982 | Fed. Rep. of Germany . |
| 50246 | 4/1980 | Japan . |
| 55429 | 3/1984 | Japan . |
| 70836 | 4/1987 | Japan . |

OTHER PUBLICATIONS

Patent Abstracts of Japan, vol. 8, No. 38 (P-255) (1475), Feb. 18, 1984, & JP-A-58 192032 (Fuji Shashin Film K.K.), Nov. 9, 1983.

Patent Abstracts of Japan, vol. 10, No. 247 (P-490) (2303), Aug. 26, 1986, & JP-A 61 75342 (Fuji Photo Film Co. Ltd.), Apr. 17, 1986.

*Primary Examiner*—Paul R. Michl

*Assistant Examiner*—Janet C. Baxter

*Attorney, Agent, or Firm*—Fitzpatrick, Cella, Harper & Scinto

[57] ABSTRACT

A photosensitive material comprises a photosensitive layer and a polymerizable layer which are laminated. An area of the polymerizable layer, corresponding to an unexposed area of the photosensitive layer, is polymerized when the photosensitive material is exposed to light with a wavelength of 400 to 900 nm and heated to 60° to 80° C.

56 Claims, 3 Drawing Sheets

PHOTOSENSITIVE MATERIAL CONTAINING A PHOTOSENSITIVE AND HEAT DEVELOPABLE ELEMENT AND A POLYMERIZABLE LAYER AND IMAGE-FORMING METHOD UTILIZING THE SAME

This application is a continuation of application Ser. No. 307,273 filed Feb. 7, 1989, now abandoned.

BACKGROUND OF THE INVENTION

1. Field of the Invention

The present invention relates to a photosensitive material used to form a polymer image, and an image forming method that employs it. More particularly it is concerned with a photosensitive material having a photosensitive and heat-developable layer, and, in particular, a photosensitive material capable of forming a polymer image having a superior contrast, value and chroma, and an image forming method that employs it.

2. Related Background Art

Energies used to form or record an image include light, sound, electricity, magnetism, heat, radiations such as electron rays and X-rays, and chemical energy, among which, in particular, widely used are light, electricity, heat energy, or a combination of any of these.

For example, a image forming method that employs the combination of light energy with chemical energy includes a silver salt photographic process and a method in which a diazo copying paper is used. The method that employs the combination of light energy with electric energy includes an electrophotographic system. The method that utilizes heat energy includes a method in which a thermo-sensitive recording paper or transfer recording paper is used. On the other hand, known as the method that utilizes electric energy is a method in which an electrostatic recording paper, electrothermal recording paper, or electrosensitive recording paper is used.

Of the above image forming methods, a silver salt photographic process can obtain an image having a high resolution. The silver salt photographic process, however, requires developing and fixing treatments that use complicated liquid compositions, or a drying treatment of an image (or a print).

Now, development is energetically made on image forming methods that can form an image through a simple processing.

For example, U.S. Pat. No. 4,629,676 teaches a method in which a polymerization reaction under dry (thermal) conditions is caused by a photosensitive reaction of silver halide that acts as a trigger, to form an image comprising a polymer.

Japanese Unexamined Patent Publication No. 62-70836 also discloses a method which comprises forming a latent image comprising silver metal produced from silver halide by imagewise exposure, and converting, under heating, a reducing agent into an oxidized product having a polymerization inhibitory power different from that of said reducing agent by utilizing a catalytic action of the above silver metal, thereby producing a difference in the polymerization inhibitory power between the reducing agent and the resulting oxidized product and also causing a thermal polymerization reaction utilizing a thermopolymerization initiator, thus forming a polymer image according to the difference in the polymerization inhibitory power.

In these methods, however, black silver which is formed by the metallic silver sometimes remains in the polymer image formed, and in that occasion an attempt to obtain a color image other than a black image may cause the mixing of a black color of a silver image into a color image to produce a dark color, resulting in the color image unsatisfactory in value and chroma.

Even in the case when no black silver remains in the polymer image, the photosensitive silver halide remains in the polymer image, and hence the color image may result in a color image unsatisfactory in that its value and chroma are not stable with time.

U.S. Pat. No. 4,649,098 discloses a method in which a reducing agent having a polymerization inhibitory power, contained in a layer containing a photosensitive silver halide, is formed into an oxidized product by imagewise consumption of itself (at exposed areas) in the course of the developing of silver halide, and then, after the reducing agent has been diffused and transferred by heating to a photopolymerizable layer on which the above layer containing a photosensitive silver halide is laminated face-to-face, light energy is uniformly applied (whole areal exposure) from the outside to cause photopolymerization at the part of the photopolymerizable layer opposing to the part (imagewise exposed area) at which the reducing agent in the above layer containing a photosensitive silver halide has been consumed, thus forming a polymer image.

The above method has the advantage that neither the black silver formed by the metallic silver nor the photosensitive silver halide remains in the polymer image formed and therefore the color image having superiority in the value, chroma and stability with time can be obtained even in the color image. It, however, is difficult to obtain a polymer image having a sufficient contrast. More specifically, the reducing agent used in the above method is in itself a reducing agent that acts as a polymerization inhibitor and turns not to act as the polymerization inhibitor after reducing silver halide. Hence, when the reducing agent at the imagewise exposed area of the layer containing a photosensitive silver halide is not sufficiently converted into an oxidized product, any sufficient polymerization can not be achieved at the part of the photopolymerizable layer opposing to the above imagewise exposed area. However, an attempt to apply a sufficient amount of heat energy in carrying out development so that the reducing agent in the imagewise exposed area may be sufficiently converted into an oxidized product, causes and oxidationreduction reaction even in an imagewise unexposed area. On the other hand, an attempt to apply the heat energy in a reduced amount in carrying out development so that the oxidation-reduction reduction may not be caused at the imagewise exposed area, results in no sufficient conversion into the oxidized product at the imagewise exposed area. Since the part of the photopolymerizable layer opposing to the imagewise exposed area of the layer containing a photosensitive silver halide can be polymerized with difficulty, light energy must be applied in a large amount upon carrying out the whole areal exposure, so that, with increase in the amount of applying the light energy, unnecessary polymerization may also take place at the part of the photopolymerizable layer opposing to the imagewise unexposed area of the layer containing a photosensitive silver halide, finally obtaining no polymer image having a sufficient contrast.

In addition, Japanese Unexamined Patent Publication No. 55-50246 discloses a photosensitive material comprising a support and a photopolymerizable composition layer, a transparent intermediate layer and a heat-development photosensitive composition layer which are laminated on the support, and a method which comprises subjecting the heat-development photosensitive composition layer to heat development to form a black silver image, followed by whole areal exposure from the heat-development photosensitive composition layer side to form a polymer image in the photopolymerizable composition layer, according to a difference in the amount of the light having been transmitted through the heat-developable and photosensitive composition layer.

In the above method, a constitution is taken such that the heat-development photosensitive composition layer and photopolymerizable composition layer are separated via an intermediate film, so that neither the black silver formed by the metallic silver nor the photosensitive silver halide remains in the polymer image formed. Thus the method has the advantage that the color image to be obtained can be a color image having superiority in value, chroma and stability with time, but is still insufficient in obtaining a polymer image having a sufficient contrast.

To discuss more specifically, in the above method, the contrast of the polymer image depends only on the difference in the amount of the light that has been transmitted through the heat-development photosensitive composition layer, and the difference between the amount of the light transmitted through an imagewise exposed area and the amount of the light transmitted through an imagewise unexposed area. In order to make close to 0% the amount of the light transmitted through the imagewise exposed area, measures can be taken to increase the amounts of the silver halide and organic silver salt in the heat-development photosensitive composition layer or to make large the layer thickness. This, however, decreases also the amount of the light transmitted through the imagewise unexposed area, consequently making small also the difference between the amounts of the light transmitted through the imagewise exposed area and imagewise unexposed area, so that no polymer image having a sufficient contrast can be obtained.

Incidentally, in the image forming method of the present invention, a difference in polymerization inhibitory power between the reducing agent and oxidized product that have been transferred is further utilized in addition to the above-mentioned difference in the amounts of the light transmitted through the imagewise exposed area and imagewise unexposed area, so that a polymer image having a sufficient contrast can be obtained.

Aiming at making visible the polymer image obtained by the above methods and further forming it into a color image, for example, U.S. Pat. No. 4,649,098 further discloses various methods that utilize the difference in, for example, physical properties and between a polymerized area and an unpolymerized area. For example, disclosed are a method in which a treatment is made using a liquid that does not dissolve the polymerized area and dissolves the layer of the unpolymerized area, to dissolve out and remove the unpolymerized area (i.e., etching); a method in which, utilizing the difference in stickiness between the polymerized area and unpolymerized area, a sheet such as plastic film is adhered and thereafter peeled to separate the polymerized area from unpolymerized area under dry conditions (i.e., peeling-apart); in the case when a polymer image is formed into a color image, a method in which a photopolymerizable layer is previously colored with use of a pigment or dye, and then subjected to the above dissolving-out (i.e, the above etching) or peeling (i.e., the above peeling-apart) to form a color image, or a method in which, utilizing the stickiness at the unpolymerized area, a coloring powder is applied to make selective coloring (i.e., torning or inking), or, utilizing the difference in liquid-permeability between the polymerized area and unpolymerized area, the unpolymerized area is selectively dyed by treating it with a dye solution.

However, no polymer image having a sufficient contrast can be obtained in the conventional polymer image forming methods as discussed above, and hence, even with employment of any of the above methods for making the image visible or forming it into a color image, the visible image and color image which are obtained from such a polymer image can not have any sufficient contrast, and particularly it has been difficult to obtain highly detailed visible image and color image.

SUMMARY OF THE INVENTION

An object of the present invention is to solve all the above problems conventionally involved, and particularly to provide a photosensitive material, and an image forming method, that can form in a faster and stabler state a polymer image having a good contrast.

Another object of the present invention is to provide a photosensitive material, and an image forming method, that can obtain a visible image or color image having superiority in value and chroma, and stability with time.

Still another object of the present invention is to provide a photosensitive material, and an image forming method, that can obtain a visible image or color image having a superior resolution and being free of any color fog.

Namely, the present invention provides a photosensitive material, comprising a photosensitive layer and a polymerizable layer which are laminated, wherein, when the photosensitive material is exposed to light with a wavelength of 400 to 900 nm and heated to 60° to 180° C., an area of the polymerizable layer, corresponding to an unexposed area of the photosensitive layer, is polymerized.

In another embodiment, the present invention provides a photosensitive material, comprising a photosensitive layer and a polymerizable layer which are laminated, wherein, when the photosensitive material is exposed to light with a wavelength of 400 to 900 nm, heated to 60° to 180° C., and exposed to light with a wavelength of from 250 to 700 nm, an area of the polymerizable layer, corresponding to an unexposed area of the photosensitive layer, is polymerized, the unexposed area being an area not exposed to light by the exposure to light with a wavelength of 400 to 900 nm.

In a preferred embodiment, the present invention provides a photosensitive material, comprising a photosensitive layer and a polymerizable layer which are laminated, wherein said photosensitive layer contains at least one of the compounds represented respectively by the following Formula (I), (II), (III), (IV) and (V):

(I)

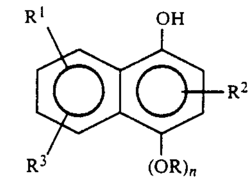

(II)

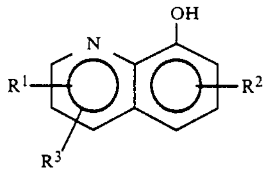

(III)

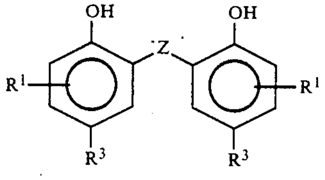

(IV)

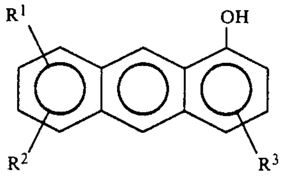

(V)

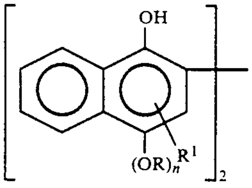

wherein R represents a hydrogen atom, a substituted or unsubstituted alkyl group or a substituted or unsubstituted aralkyl group; $R^1$ and $R^2$ each represent independently a hydrogen atom, a halogen atom, an alkoxy group, a substituted or unsubstituted alkyl group, a substituted or unsubstituted aryl group or a substituted or unsubstituted aralkyl group; $R^3$ represents a hydrogen atom, a hydroxyl group or a substituted or unsubstituted alkyl group; n is an integer of 0 or 1; Z is a divalent linking group, which represents an alkylidene group, an aralkylidene group or a sulfur atom.

The present invention also provides an image forming method, comprising the steps of;
(a) subjecting to imagewise exposure a photosensitive material comprising a photosensitive layer and a polymerizable layer which are laminated;
(b) heating the photosensitive material; and
(c) polymerizing an area of the polymerizable layer, which area corresponds to an unexposed area of the photosensitive layer of the photosensitive material.

In another embodiment of the method, the present invention provides an image forming method, comprising the steps of;
(a) subjecting to imagewise exposure a photosensitive material comprising a photosensitive layer and a polymerizable layer which are laminated; and
(b) polymerizing an area of the polymerizable layer, which area corresponds to an unexposed area in the photosensitive layer of the photosensitive material.

In still another embodiment of the method, the present invention provides an image forming method, comprising the steps of;
(a) subjecting a photosensitive layer to imagewise exposure;
(b) heating the laminated material, after laminating a polymerizable layer on the photosensitive layer; and
(c) polymerizing an area of the polymerizable layer, which area corresponds to an unexposed area of the photosensitive layer of said photosensitive material.

In a further embodiment of the method, the present invention provides an image forming method, comprising the steps of;
(a) subjecting a photosensitive layer to imagewise exposure; and
(b) polymerizing an area in said polymerizable layer, which area corresponds to an unexposed area of the photosensitive layer of the laminated material, after laminating a polymerizable layer on the photosensitive layer.

In a still further embodiment of the method, the present invention provides an image forming method, comprising the steps of;
(a) subjecting a photosensitive layer to imagewise exposure;
(b) heating the photosensitive layer; and
(c) polymerizing an area in said polymerizable layer, which area corresponds to an unexposed area of the photosensitive layer, after laminating a polymerizable layer on said photosensitive layer.

In a still further embodiment of the method, the present invention provides an image forming method, comprising the steps of;
(a) subjecting a photosensitive layer to imagewise exposure;
(b) heating the photosensitive layer;
(c) laminating a polymerizable layer on said photosensitive layer, and then heating the laminated material; and
(d) polymerizing an area of the polymerizable layer, which area corresponds to an unexposed area of the photosensitive layer of the laminated material.

In a still further embodiment of the method, the present invention provides an image forming method, comprising the steps of;
(a) subjecting to imagewise exposure a photosensitive material comprising a photosensitive layer and a polymerizable layer which are laminated;
(b) heating the photosensitive material; and
(c) polymerizing an area of the polymerizable layer, which area corresponds to an unexposed area of the photosensitive layer of the photosensitive material, to form a positive image and a negative image with respect to said image exposure.

Other embodiments of the present invention will become apparent from the following description.

DETAILED DESCRIPTION OF THE PREFERRED EMBODIMENTS

Figure 1A:
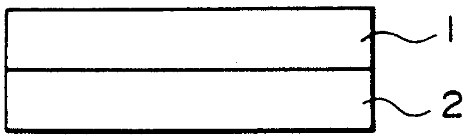
FIGS. 1A to 1D illustrate photosensitive materials according to the present invention.
Figure 1B:
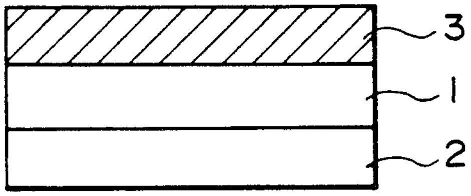
Figure 1C:
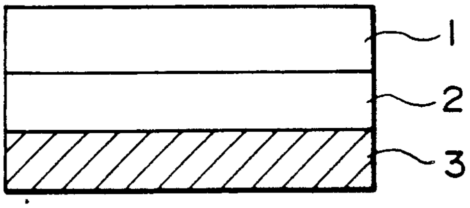
Figure 1D:
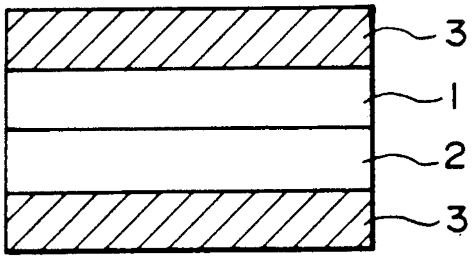

The photosensitive material of the present invention include (1) a photosensitive material, comprising a photosensitive layer and a polymerizable layer which are laminated, wherein, when the photosensitive material is exposed to light with a wavelength of 400 to 900 nm and heated to 60° to 180° C., an area in said polymerizable layer, corresponding to an unexposed area of the photosensitive layer, is polymerized (hereinafter "photosensitive material (1)"), and (2) a photosensitive material, comprising a photosensitive layer and a polymerizable layer which are laminated, wherein, when said photosensitive material is exposed to light with a wavelength of 400 to 900 nm, heated to 60° to 180° C. an area of the polymerizable layer, corresponding to an unexposed area of the photosensitive layer, is polymerized and exposed to light with a wavelength of from 250 to 700 nm, the unexposed area being an area not exposed to light by said exposure to light with a wavelength of 400 to 900 nm (hereinafter "photosensitive material (2)"). Here, the wording "an area of the polymerizable layer, corresponding to an unexposed area of the photosensitive layer, is polymerized" means that polymer polymerizable precursors in the unexposed portion are bound or linked to each other through the above processing, thereby being polymerized. In the photosensitive materials (1) and (2), what is meant by the photosensitive layer is a layer which contains a photosensitive and heat-developable element, and also which is capable of forming metallic silver by exposure to light and heating, as described below, and more specifically a layer which contains at least a photosensitive silver halide, an organic silver salt and a reducing agent. What is meant by the polymerizable layer is a layer capable of being polymerized by exposure to light and heating, as described below, and more specifically a layer containing at least a polymerizable polymer precursor and a polymerization initiator. Both of these layers may preferably be directly laminated.

First, the photosensitive material (1) of the present invention is a photosensitive material in which only an unexposed area is polymerized when the photosensitive material is exposed to light on the surface of its photosensitive layer by the use of light, to which the silver halide has a sensitivity, with a wavelength of 400 to 900 nm and an energy of 1 $mJ/cm^2$ at maximum from light source such as sunlight, a tungsten lamp, a mercury lamp, a halogen lamp, a xenon lamp, a fluorescent lamp, an LED or a laser, followed by heating to 60° to 180° C., preferably 70° to 150° C., for 1 to 40 seconds, preferably 1 to 30 seconds, by the use of a face heater element or a heat roller, or dielectric heating or electric heating (in which a substrate is provided and this substrate is made to serve as an electric heating layer, or an electric heating layer is provided beneath the substrate). The heating in the present invention may be carried out either continuously or intermittently, but in either case the heating may preferably be carried out with a temperature gradient so that the temperature may be raised from a lower temperature to a higher temperature within the above temperature range.

Next, the photosensitive material (2) of the present invention is a photosensitive material in which only an unexposed area is polymerized when, after the above exposure to light and heating, the photosensitive material is subjected to exposure to light by the use of light, to which the polymerization initiator in the polymerizable layer has a sensitivity, with a wavelength of not less than 250 nm, preferably from 250 nm to 700 nm, and more preferably from 300 nm to 500 nm, and an energy of up to 500 $mJ/cm^2$ at maximum.

The photosensitive materials (1) and (2) of the present invention will be described below in greater detail.

As the silver halide contained in the photosensitive layer of the photosensitive materials (1) and (2) of the present invention, any silver halides known in photographic techniques can be used, including, for example, silver chloride, silver bromide, and silver iodide, as well as silver chlorobromide, silver chloroiodide, silver iodobromide and silver chloroiodobromide.

The halogen composition of silver halide grains may be uniform or non-uniform in their surfaces and insides. In the present invention, the silver halide grains may preferably have a grain size of from 0.001 $\mu m$ to 10 $\mu m$, more preferably from 0.001 $\mu m$ to 5 $\mu m$, in average grains size.

These may have been subjected to chemical sensitization and optical sensitization as conventionally done with respect to usual photographic emulsions. More specifically, as the chemical sensitization, sulfur sensitization, noble metal sensitization and reduction sensitization can be used, and applicable as the optical sensitization are methods in which optical sensitizing dyes such as cyanine dyes and merocyanine dyes are used.

The organic silver salt that can be used includes organic silver salts as described in "SHASHIN KOGAKU NO KISO (Basis of Photographic Engineering), The Volume of Non-silver-salt, p. 247" or Japanese Unexamined Patent Publication No. 59-55429, as exemplified by silver salts of an organic acid such as behenic acid, and silver salts of triazoles, which can be used alone or appropriately in combination with two or more kinds.

As the reducing agent contained in the photosensitive layer of the photosensitive materials (1) and (2) of the present invention, suitably used are aromatic hydroxyl compounds capable of producing a compound having a large polymerization inhibitory power against the polymerizable polymer precursor, contained in the polymerizable layer, by the oxidation-reduction reaction with the organic silver salt or the like under heating using silver as a catalyst (which compound is generically called an "oxidized product"in the present invention), and also capable of, when heated, transferring at least the oxidized product, among the reducing agent and oxidized product, from the photosensitive and heat-developable layer to the polymerizable layer. More specifically, they include hydroxynaphthalenes, hydroxybinaphthyls, hydroxyanthracenes, hydroxyquinolines, and bisphenols, which, to show them using a general formula, are represented by Formula (I), (II), (III), (IV) or (V):

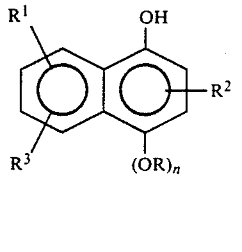

(I)

-continued

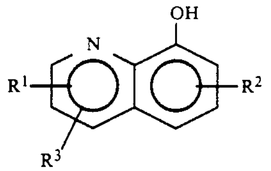

(II)

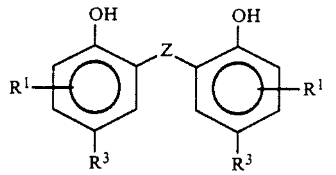

(III)

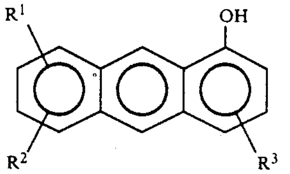

(IV)

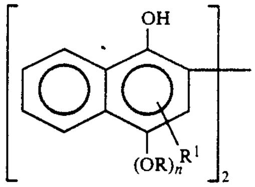

(V)

In the above Formulas (I) to (V), R represents a hydrogen atom, a substituted or unsubstituted alkyl group or a substituted or unsubstituted aralkyl group; $R^1$ and $R^2$ each represent independently a hydrogen atom, a halogen atom, an alkoxy group, a substituted or unsubstituted alkyl group, a substituted or unsubstituted aryl group or asubstituted or unsubstituted aralkyl group; $R^3$ represents a hydrogen atom, a hydroxyl group or a substituted or unsubstituted alkyl group; n is an integer of 0 or 1; Z is a divalent linking group, which represents an alkylidene group, an aralkylidene group or a sulfur atom. Still more specifically, preferably used are 4-methoxy-1-naphthol, 4-ethoxy-1-naphthol, 2-methyl-4-methoxy-1-naphthol, 5-methyl-4-methoxy-1-naphthol, 1,5-dihydroxynaphthalene, 1,1'-dihydroxy-2,2'-binaphthyl, 4,4'-dimethoxy-1,1'-dihydroxy-2,2'-binaphthyl, 1-methoxy-5-hydroxyanthracene, 1-ethoxy-5-hydroxyanthracene, 1-methoxy-4-methyl-5-hydroxyanthracene, 1-methoxy-4,8-dimethyl-5-hydroxyanthracene, 8-hydroxyquinoline, 4-methyl-8-hydroxyquinoline, 4,8-dihydroxyquinoline, 2,2'-methylenebis(4-methoxyphenol), 2,2'-methylenebis(4-ethoxyphenol), 2,2'-methylenebis(4-methylphenol), and 2,2'-methylenebis(4-ethylphenol). These may be used in combination of two or more kinds.

The photosensitive layer of the photosensitive materials (1) and (2) of the present invention can be formed by dissolving or dispersing the above-described silver salt and reducing agent, which are contained as essential components, and optionally binder in water or a solvent, and coating the resulting solution on a support 3 as illustrated in FIG. 1, followed by drying. Also the photosensitive layer, if the binder itself can achieve necessary strength of the photosensitive material, can be formed, without using the support 3, by incorporating the above essential components into a filmy or sheet-like member formed with the binder.

The photosensitive layer 1 may also contain an antifogging agent, a surface active agent, a sensitizer for photography, a stabilizer, a thickening agent, an antistatic agent, a plasticizer and an alkali-generating agent. Usable as the support 3 are sheets of metals such as zinc and aluminum, films of plastics such as triacetyl cellulose and polyethylene terephthalate, glass, paper, or resin-coated paper, whose shape may be of a flat sheet, a cylinder or a roll, without any particular limitations.

The photosensitive layer may have a film thickness of from 0.1 μm to 2 mm, preferably from 1 μm to 0.1 mm.

Preferred mixing proportion of the above components in the photosensitive layer is set out below.

The silver halide may preferably be in the proportion of from 0.1 to 100 parts by weight, and more preferably from 0.5 to 30 parts by weight, based on 100 parts by weight of the organic silver. The reducing agent may preferably be 0.5 to 3.0 mols, and more preferably from 0.7 to 1.3 mols, per mol of the silver salt.

The polymerizable layer of the photosensitive materials (1) and (2) of the present invention will be described below in greater detail.

As the polymerizable polymer precursor incorporated in the polymerizable layer, a compound having at least one reactive vinyl group in its molecule can be utilized, and there can be used, for example, at least one selected from the group consisting of reactive vinyl group-containing monomers, reactive vinyl group-containing oligomers and reactive vinyl group-containing polymers.

The reactive vinyl group in these compounds includes substituted or unsubstituted vinyl groups having polymerizable reactivity as exemplified by styrene vinyl groups, acrylic acid vinyl groups, methacrylic acid vinyl groups, allyl vinyl groups, and vinyl ethers, as well as ester vinyl groups such as vinyl acetate.

Specific examples of the polymerizable polymer precursor satisfying such conditions are as follows.

They may include monovalent monomers as exemplified by styrene, methylstyrene, chlorostyrene, bromostyrene, methoxystyrene, dimethylaminostyrene, cyanostyrene, aminostyrene, acrylic acid, methyl acrylate, ethyl acrylate, cyclohexyl acrylate, methacrylic acid, methyl methacrylate, ethyl methacrylate, propyl methacrylate, butyl methacrylate, phenyl methacrylate, cyclohexyl methacrylate, vinyl pyridine, N-vinylpyrrolidone, N-vinylimidazole, N-methyl-2-vinylimidazole, propyl vinyl ether, butyl vinyl ether, isobutyl vinyl ether, β-chloroethyl vinyl ether, phenyl vinyl ether, p-methylphenyl vinyl ether and p-chlorophenyl vinyl ether; divalent monomers as exemplified by divinylbenzene, oxalic acid di(ethyl acrylate), oxalic acid di(methyl ethyl acrylate), malonic acid di(ethyl acrylate), malonic acid di(methyl ethyl acrylate), succinic acid di(ethyl acrylate), glutaric acid di(ethyl acrylate), adipic acid di(ethyl acrylate), maleic acid di(ethyl acrylate), fumaric acid di(ethyl acrylate), β,β'-dimethylglutaric acid di(ethyl acrylate), 1,4-phenylenebis(oxyethyl acrylate), 1,4-phenylenebis(oxymethyl ethyl acrylate), 1,4-bis(acryloyloxyethoxy)cyclohexane, 1,4-bis(acryloyloxymethylethoxy)cyclohexane, oxalic acid di(ethyl methacrylate), oxalic acid di(methyl ethyl methacrylate), malonic acid di(ethyl methacrylate), malonic acid di(methyl ethyl methacrylate), succinic acid di(ethyl methacrylate), succinic acid di(methyl ethyl methacrylate), glutaric acid di(ethyl methacrylate), adipic acid di(ethyl methacrylate), maleic acid di(ethyl methacrylate), fumaric acid di(ethyl methacrylate), fumaric acid di(methyl ethyl methacrylate), $\beta,\beta'$-dimethylglutaric acid di(ethyl methacrylate), 1,4-phenylenebis(oxyethyl methacrylate), and 1,4-bis(methacryloyloxyethoxy)cyclohexane acryloyloxyethoxyethyl vinyl ether; trivalent monomers as exemplified by pentaerythritol acrylate, pentaerythritol methacrylate, pentaerythritol tri(hydroxystyrene), 1,1,1-trimethylolpropane triacrylate, 1,1,1-trimethylolpropane trimethacrylate, 1,1,1-trimethylolpropane tri(ethyl acrylate). These polymerizable polymer precursors may be used in combination of two or more kinds.

A polymerization initiator, that may accelerate the image formation attributable to the polymerization reaction, may be added to the polymerizable layer. As the polymerization initiator, a thermopolymerization initiator may preferably be used in the photosensitive material (1), and a photopolymerization initiator may be used, in the photosensitive material (2), but it is also possible to use both of them in combination.

Known initiators can be used as the thermopolymerization initiator contained in the polymerizable layer of the photosensitive material (1) of the present invention, which may include, for example, azo initiators and peroxide initiators. The azo initiator refers to an organic compound having at least one nitrogen-nitrogen double bond in its molecule, and may include, for example, azobisisobutyronitrile, azobiscyclohexanecarbonitrile, azobismethylphenethylcarbonitrile, azobis-secamylonitrile, azobisphenylethane, azobiscyclohexylpropylonitrile, azobismethylchloroethane, triethylazobenzene, phenylazoisobutyronitrile, and 9-(p-nitrophenylazo)-9-phenylfluorenone. The peroxide initiator includes almost all the compounds so long as they are organic compounds having at least one oxygen-oxygen bond in the molecule. For example, it may include methyl ethyl ketone peroxide, cyclohexanone peroxide, 3,3,5-trimethylcyclohexanone peroxide, methylcyclohexanone peroxide, acetylacetone peroxide, 1,1'-bis(tertiary-butylperoxy)-3,3,5-trimethlcyclohexane, 1,1'-bis(tertiary-butylperoxy) cyclohexane, n-butyl-4,4-bis(tertiary-butylperoxy)valerate, 2,2'-bis(tertiary-butylperoxy)butane, tertiry-butyl hydroperoxide, cumene hydroperoxide, diisopropylbenzene hydroperoxide, para-menthane hydroperoxide, 2,5-dimethylhexane-2,5-dihydroperoxide, 1,1,3,3,-tetramethylbutyl hydroperoxide, ditertiary-butyl peroxide, tertiary-butylcumyl peroxide, dicumyl peroxide, $\alpha,\alpha'$-bis(tertiary-butylperoxyisopropyl) benzene, 2,5-dimethyl-2,5-di(tertiary-butylperoxy) hexane, 2,5-dimethyl-2,5-di(tertiary-butylperoxy) hexyne-3-acetyl peroxide, isobutyl peroxide, octanoyl peroxide, decanoyl peroxide, lauroyl peroxide, 3,5,5-trimethylhexanoyl peroxide, succinic acid peroxide, benzoyl peroxide, 2,4-dichldorobenzoyl peroxide, m-toluoyl peroxide, diisopropyl peroxydicarbonate, di-2-ethylhexyl peroxydicarbonate, dinormalpropyl peroxydicarbonate, di-2-ethoxyethyl peroxydicarbonate, dimethoxyisopropyl peroxydicarbonate, di(3-methyl-3-methoxybutyl)peroxydicarbonate, tertiary-butyl peroxyacetate, tertiary-butyl peroxyisobutyrate, tertiary-butyl peroxypivalate, tertiary-butyl peroxyneodecanoate, tertiary-butyl peroxyoctanoate, tertiary-butyl peroxy-3,5,5-trimethylhexanoate, tertiary-butyl peroxylaurate, tertiary-butyl peroxybenzoate, ditertiary-diperoxyisophthalate, 2,5-dimethyl-2,5-di(benzoylperoxy)hexane, tertiary-butyl maleic acid peroxide, and tertiary-peroxyisopropyl carbonate, by which, however, the present invention is by no means limited, and other known thermopolymerization initiators can also be used.

The photopolymerization initiator contained in the polymerizable layer of the photosensitive material (2) of the present invention includes, for example, carbonyl compounds, sulfur compounds, halogen compounds, and photopolymerization initiators of redox type.

Specifically, the carbonyl compounds include diketones as exemplified by benzyl, 4,4'-dimethoxybenzyl, diacetyl, and camphorquinone; benzophenones as exemplified by 4,4'-diethylaminobenzophenone, and 4,4'-dimethylbenzophenone; acetophenones as exemplified by acetophenone, 4-methoxyacetophenone; benzoin alkyl ethers; thioxanthones as exemplified by 2-chlorothioxanthone, 2,5-diethylthioxanthone, and thioxanthone-3-carboxylic acid $\beta$-methoxy ethyl ester; chalcones and styrylketones having a dialkylamino group; and cumarines as exemplified by 3,3'-carbonlbis (7-methoxycoumarin), and 3,3'-carbonylbis (7-diethylaminocoumarin).

The sulfur compounds include disulfides as exemplified by dibenzothiazolyl sulfide, decylphenyl sulfide and disulfides.

The halogen compounds include, for example, carbon tetrabromide, quinolinesulfonyl chloride, and S-triazines having a trihalomethyl group.

The photopolymerization initiators of redox type include a combination of a trivalent iron ionic compound (as exemplified by ferric ammonium citrate) with a peroxide, and a combination of a photoreducing dye such as riboflavin or Methylene Blue with a reducing agent such as triethanolamine or ascorbic acid.

In the photopolymerization initiator described above, two or more compounds can also be used in combination to obtain a more efficient photopolymerization reaction.

Such combination of the photopolymerization initiators includes a combination of chalcones having a dialkylamino group and styrylketones or coumarins, with S-triazines having a trihalomethyl group or camphorquinone.

These polymerization initiators may also be used in combination of two or more of them, or in combination with the above compounds.

There may also be optionally contained a polymerization inhibitor, a surface active agent, a binder, etc. for the purpose of improving the storage stability of the polymerizable layer.

The polymerizable layer of the photosensitive materials (1) and (2) of the present invention can be formed by dissolving or dispersing the above-described polymerizable polymer precursor, which is contained as an essential component, and optionally a binder in water or a solvent, and coating the resulting solution on a support 3 as illustrated in FIG. 1, followed by drying. When the polymerizable layer 2, itself can achieve necessary strength of the photosensitive material, the layer 2 can also be used as a support without using the support 3.

Usable as the support 3 are metals such as aluminum and copper, plastic films such as a polyester film, a polyimide film, an aromatic polyamide film, a polycarbonate film, a polysulfone film, a polyphenylene sulfite film, a polyether imide film and a fluorine-containing film, coated paper, and synthetic paper, which not only play a role to hold the photosensitive layer or polymerizable layer, but also, in the course of polymerization, when provided on both sides of the polymerizable layer so as to hold the polymerizable layer therebetween, play a role to prevent polymerization from being inhibited by oxygen and also play a role as a peel substrate used when a polymer image formed is visualized by the peel-apart method. In the case of the laminated photosensitive material of the present invention, the support 3 may be provided thereon with the polymerizable layer 2 and the photosensitive layer 1 in this order, or the support 3 may be provided thereon with the photosensitive layer 1, the polymerizable layer 2 and another support 3 in this order. The photosensitive layer and the polymerizable layer may also be provided separately on the support. The support may have a thickness of from 2 μm to 2 mm, and preferably from 3 μm to 1 mm. Further, it may be of any form including a flat sheet, a cylinder, a roll and so forth, without any particular limitations.

Suitable binders used in the photosensitive layer 1 or the polymerizable layer 2 of the photosensitive materials (1) and (2) of the present invention can be selected from a wide range of resins.

They specifically include cellulose esters as exemplified by nitrocellulose, cellulose phosphate, cellulose sulfate, cellulose acetate, cellulose propionate, cellulose butyrate, cellulose myrystate, cellulose palmitate, cellulose acetate.propionate, and cellulose acetate.butyrate; cellulose ethers as exemplified by methyl cellulose, ethyl cellulose, propyl cellulose, and butyl cellulose; vinyl resins as exemplified by polystyrene, polyvinyl chloride, polyvinyl acetate, polyvinyl butyral, polyvinyl acetal, polyvinyl alcohol, and polyvinyl pyrrolidone; copolymer resins as exemplified by a styrene/-butadiene copolymer, a styrene/acrylonitrile copolymer, a styrene/butadiene/acrylonitrile copolymer, and a vinyl chloride/vinyl acetate copolymer; acrylic resins as exemplified by polymethyl methacrylate, polymethyl acrylate, polybutyl acrylate, polyacrylic acid, polymethacrylic acid, polyacrylamide, and polyacrylonitrile; polyesters as exemplified by polyethylene terephthalate; polyarylate resins as exemplified by poly(4,4'-isopropylidene,diphenylene-co-1,4-cyclohexylenedimethylene carbonate), poly(ethylenedioxy-3,3'-phenylene thiocarbonate), poly(4,4'-isopropylidene,-diphenylene carbonate-co-terephthalate), poly(4,4'-isopropylidene,diphenylene carbonate), poly(4,4'-sec-butylidene,diphenylene carbonate), and poly(4,4'-isopropylidene,diphenylene carbonate-block-oxyethylene); polyamides; polyimides; epoxy resins; phenol resins; polyolefins as exemplified by polyethylene, polypropylene, and chlorinated polyethylene; and natural polymers such as gelatin.

In the polymerizable layer used in the present invention, a binder is not an essential component. This may not necessarily be contained if the film properties, sensitivities or the like of the layer can be sufficiently secured.

Besides this, it is also possible to optionally add thereto a coloring material, a polymerization inhibitor, a photo-discoloration preventive agent, a solid solvent, a surface active agent, an antistatic agent, an alkali-generating agent, etc.

The polymerizable layer may have a film thickness of from 0.1 μm to 2 mm, and preferably from 1 μm to 0.1 mm.

As to the composition of the polymerizable layer, the polymerization initiator may preferably be in the proportion of from 0.1 to 50 parts by weight, more preferably from 0.5 to 30 parts by weight, based on 100 parts by weight of the polymerizable polymer precursor.

Embodiments of the photosensitive material of the present invention are shown in FIGS. 1A to 1D, but the photosensitive material of the present invention is by no means limited to these so long as the photosensitive layer and polymerizable layer are directly laminated.

The image forming method of the present invention will be described below.

The image forming method of the present invention may be either a method in which the above photosensitive material (1) or (2) is used, i.e., a method in which the photosensitive layer and polymerizable layer have been laminated from the first, or a method in which the above two layers are laminated in the course of its respective steps.

The image forming method of the present invention can be roughly grouped into the following two, depending on whether the step of polymerizing the polymerizable layer comprises photopolymerization or thermopolymerization. Namely;

(1) An image forming method, comprising the steps of;
  (a) subjecting the photosensitive layer containing at least the photosensitive silver halide, organic silver salt and reducing agent, to imagewise exposure to form a latent image comprised of silver metal;
  (b) heating the photosensitive layer in which the latent image has been formed, to form metallic silver and the oxidized product of said reducing agent;
  (c) transferring by heating, at least the oxidized product, among the reducing agent and oxidized product, from the photosensitive layer to the polymerizable layer containing at least the polymerizable polymer precursor, to separate these from the metallic silver; and
  (d) thermopolymerizing the polymerizable polymer precursor present in an area of the polymerizable layer to which area no oxidized product has been transferred, to form a polymer image (hereinafter called "polymerization initiator (1)"); and (2) an image forming method, comprising the steps of;
  (a) subjecting the photosensitive layer containing at least the photosensitive silver halide, organic silver salt and reducing agent, to imagewise exposure to form a latent image comprised of silver metal;
  (b) heating the photosensitive layer in which the latent image has been formed, to form metallic silver and the oxidized product of the above reducing agent;
  (c) transferring by heating, at least the oxidized product, among the above reducing agent and oxidized product, from the photosensitive layer to the polymerizable layer containing at least the polymerizable polymer precursor, to separate these from the above metallic silver; and
  (d) photopolymerizing the above polymerizable polymer precursor present in an area in the above polymerizable layer to which area no oxidized product has been transferred, to form a polymer image (hereinafter called "polymerization initiator (2)").

The method of the present invention, comprising the above steps, is chiefly characterized by using;

(A) the photosensitive layer containing at least the photosensitive silver halide, organic silver salt and reducing agent, and (B) the polymerizable layer containing the polymerizable polymer precursor;

(1) transferring at least the oxidized product, among the above reducing agent and oxidized product, from the above photosensitive layer (A) to the polymerizable layer (B), without transferring the metallic silver produced from the silver salt; and (2) polymerizing the area of the above polymerizable layer (B) to which area no oxidized product has been transferred, in other words, the area in the polymerizable layer (B), corresponding to an imagewise unexposed area of the photosensitive layer (A).

Thus, the polymer image obtained by the method of the present invention has a good contrast and is free of inclusion of metallic silver and photosensitive silver halide, so that the image can be superior in value and chroma, and moreover superior in the stability of these properties with time.

Embodiments of the respective steps comprised in the methods (1) and (2) of the present invention will be described below with reference to the drawings.

Figure 2A:
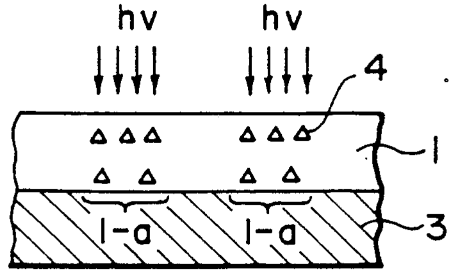
FIGS. 2A to 2D are diagramatical cross sections to illustrate embodiments of the respective steps in the image forming method of the present invention.

Step (a) in the above is the step of carrying out the writing of an image by light, where, as illustrated in FIG. 2A, a photosensitive layer 1 is exposed to light for a desired image. This exposure to light may include digital exposure.

As a result, silver metal 4 are formed from the silver halide in an exposed area 1-*a*, which forms the latent image. The silver metal 4 thus formed acts as a catalyst for the thermal reaction between the organic silver salt and reducing agent contained in the photosensitive layer 1.

The exposure at this stage of the writing of the latent image may be carried out by appropriately selecting conditions under which any desired performances such as a sufficient contrast can be obtained in the resulting polymer image, depending on the concentration, etc. of the silver salt contained in the photosensitive layer.

The exposure is carried out under an energy of up to 1 $mJ/cm^2$ at maximum, through a mask having an optical density of 3.0 or more at the masked portion on the surface of the photosensitive layer, using the active light to which the silver halide has a sensitivity, as exemplified by light of 400 nm or less in the case when the silver halide is silver chloride and has not been sensitized, light of 450 nm or less in the case when the silver halide is silver bromide and has not been sensitized, light of 480 nm or less in the case when the silver halide is silver iodobromide and has not been sensitized, and light within the sensitizing region in the case when the silver halide has been sensitized (e.g. light having a wavelength of up to about 1,000 nm when it has been infrared-sensitized). The light source therefor is exemplified by sunlight, a tungsten lamp, a mercury lamp, a halogen lamp, a xenon lamp, a fluorescent lamp, an LED or a laser.

Figure 2B:
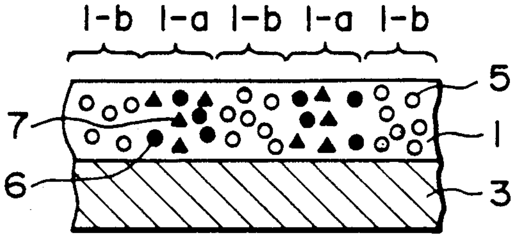

Next, in step (b) of the above, the photosensitive layer on which the latent image has been formed is heated, so that, as illustrated in FIG. 2B, the silver metal 4 selectively act as a catalyst in the exposed area 1-*a*, where the organic silver salt is reduced to metallic silver 7 and at the same time the reducing agent 5 is oxidized to form an oxidized product 6. As a result, there are formed the exposed area 1-*a* containing the oxidized product 6 and the metallic silver 7 and an unexposed area 1-*b* containing the reducing agent 5. Since, as herein described below, the reducing agent 5 used in the photosensitive layer 1 is usually an oxidized product having a polymeization inhibitory power against the polymerizable polymer precursor, which is preferably any of the compounds represented by Formula (I) to (V), an image which is ascribable to the difference in the polymeization inhibitory power, constituted by the distribution of the reducing agents 5 and oxidized products 6, is formed in the photosensitive layer 1.

The heating in this step (b) is carried out at 60° to 150° C., preferably 70° to 140° C., for 1 to 40 seconds, preferably 1 to 30 seconds. In the instance where the reducing agent and oxidized product are transferred together in the next step (c), the heating may be carried out by appropriately selecting conditions necessary to form inside the photosensitive material the difference in the polymerization inhibitory power, which is effective for the formation of the image. Alternatively, in the instance where the only oxidized product is selectively transferred in the next step (c), the heating may be carried out by appropriately selecting conditions that may make a difference in transfer performances (as exemplified by sublimation properties) between the reducing agent and oxidized product, so as to enable such selective transfer.

Figure 2C:
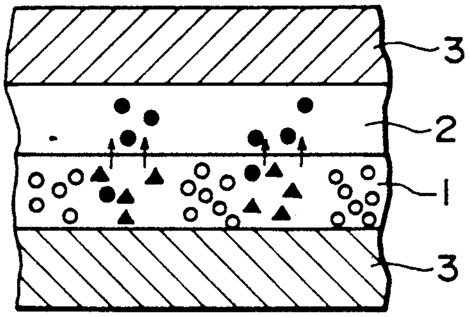

Next, in step (c), with respect to a polymerizable layer 2 brought into direct contact or adjacency, as illustrated in FIG. 2C, with the photosensitive layer 1 on which the image comprised of the above reducing agent and oxidized product has been formed, at least the oxidized product among the reducing agent and oxidized product is transferred from the photosensitive layer 1 to the polymerizable layer 2, thereby separating these from the above metallic silver.

The photosensitive layer 1 and polymerizable layer 2 may also have been laminated prior to the above step (a), or may be laminated after the above step (a) or step (b). In other words, the photosensitive layer 1 and polymerizable layer 2 may be laminated at least before making transfer of the reducing agent and oxidized product or the oxidized product in step (c). Provided that they may preferably be laminated after step (b) to obtain a polymer image having a better contrast. In FIG. 2C, illustrated is an embodiment in which the oxidized product 6 is transferred to the polymerizable layer 2. The present invention, however, is not limited to this embodiment, and may include an embodiment in which the reducing agent 5 and oxidized product 6 are transferred together, according to which it is also possible. by transferring them, to form an image having a difference in the polymerization inhibitory power against the polymerizable polymer precursor in the polymerizable layer 2.

The heating for the transfer in the above step (c) is carried out under conditions of 70° to 180° C., and preferably 80° to 150° C., for 1 to 40 seconds, and preferably 1 to 30 seconds.

Figure 2D:
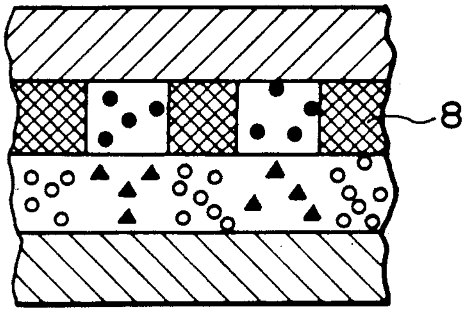

Next, in the above step (d), energy such as heat or light is applied to the polymerizable layer 2, so that, as illustrated in FIG. 2D, a difference in a polymer formation state is produced between the area to which the oxidized product has been transferred and the area to which no oxidized product has been transferred, which difference brings about the formation of a polymer image on the area to which no oxidized product has been transferred.

In the instance of the thermopolymerization, the polymerizable layer is heated at 70° to 180° C., and preferably 80° to 150° C., for 1 to 40 seconds, and preferably 1 to 30 seconds. In the instance of the photopolymerization, the polymerizable layer is subjected to whole areal exposure by the use of light having a wavelength of not less than 250 nm, preferably from 250 to 700 nm, and more preferably from 300 to 500 nm, and an energy of up to 500 mJ/cm$^2$ at maximum.

Next, the photosensitive layer 1 is separated from the polymerizable layer 2 on which the polymer image according to the present invention has been formed.

Figure 3A:
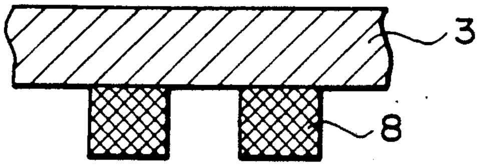
FIGS. 3A and 3B are diagramatical cross sections to illustrate embodiments of the steps of making an image visible in the image forming method of the present invention.

FIG. 3A illustrates an embodiment in which the unpolymerized area in the polymerizable layer 2, which area has not been polymerized because of the polymerization inhibitory power of the oxidized product, has a stickiness and the sticky area has been transferred to the photosensitive layer 1 when the photosensitive layer is separated, leaving only the polymerized area 8 in the polymerizable layer 2. The present invention, however, is by no means limited to this embodiment. For example, after the step (c), there may be carried out the separation of the photosensitive layer (1) from the polymerizable layer (2) and then the step (d).

The method of the present invention may not be limited to the method in which the above respective steps (a) to (d) are carried out as respectively separate steps. For example, in carrying out the heating of the photosensitive layer in step (b), the photosensitive layer 1 and polymerizable layer 2 may be brought into contact or adjacency to carry out the heating of them, so that it is possible to simultaneously achieve the "formation of the metallic silver and oxidized product" in step (b) and the "transfer of at least the oxidized product among the reducing agent and oxidized product" in step (c). It is also possible to simultaneously carry out, for example, the "transfer" in step (c) and the "polymerizing" in step (d). It is further possible to simultaneously carry out steps (b), (c) and (d).

Figure 3B:
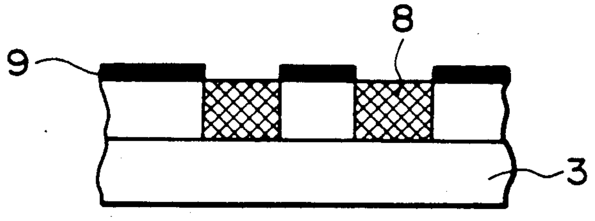

Methods of forming into a color image the polymer image obtained after step (d) according to the method of the present invention may include, for example, a method in which coloring materials are incorporated in the polymerizable layer, and the resulting layer is then laminated on a separate imagereceiving sheet, followed by heating, pressing and so forth to transfer the unpolymerized area to the imagereceiving sheet, and a method in which, as illustrated in FIG. 3B, a toner or ink 9 is adhered to the unpolymerized area 9.

The photosensitive material and image forming method having been described above in detail enables faster and stabler formation of the polymer image having a good contrast, and also can be free of any influence of the black color of the silver image to obtain the visible image or color image having a superiority in the value and chroma and the stability of these properties with time.

Moreover, the photosensitive material and image forming method of the present invention can obtain a visible image or color image having a superior resolution and free from any color fog.

EXAMPLE 1

Preparation of photosensitive layer

A composition as shown below was stirred with use of a homomixer at 5,000 rpm for 10 minutes to prepare an emulsion.

| | |
|---|---|
| Silver bromide | 1 part |
| Silver behenate | 5 parts |
| 4-Methoxy-1-naphthol | 2 parts |
| Behenic acid | 2 parts |
| Polyvinyl butyral | 10 parts |
| (polymerization degree: 2,200) | |
| Isopropanol | 40 parts |
| Methyl ethyl ketone | 40 parts |

Next, the resulting emulsion was coated on a polyester film with use of an applicator so as to give a dried film thickness of 4 μm, to obtain photosensitive layer (1).

Preparation of polymerizable layer

A composition as shown below was thoroughly stirred, and uniformly dispersed and dissolved to prepare a coating solution.

| | |
|---|---|
| Methyl methacrylate/butyl methacrylate copolymer | 60 parts |
| Trimethylolpropane triacrylate | 40 parts |
| 2,4-Diethylthioxanthone | 4 parts |
| Ethyl dimethylaminobenzoate | 3 parts |
| Permanent Red 4R | 12 parts |
| Methyl ethyl ketone | 400 parts |

Next, this coating solution was coated on a polyester film with use of an applicator so as to give a dried film thickness of 3 μm to obtain polymerizable layer (1).

Image formation

A mask was superposed on the photosensitive layer (1), and then was exposed to light for 50 msec with a distance of 5 cm from a fluorescent lamp having a fluorescent peak at 405 nm and an electric power of 10 W, thereby forming an imagewise latent image. Then, the mask was removed, and the layer was allowed to pass for 20 seconds through a heat developing machine regulated to 95° C. to cause an oxidation-reduction reaction in the photosensitive layer. Thus a silver image was imagewise formed in the latent image portion. Next, the resultant photosensitive layer (1) and polymerizable layer (1) were superposed each other so that the photosensitive layer and polymerizable layer may come into face-to-face contact, and then heated to 140° C. for 2 seconds to effect transfer of the oxidized product. The whole area of the polymerizable layer (1) was exposed to light for 40 seconds with a distance of 2 cm from a fluorescent lamp having a fluorescent peak at 380 nm and an electric power of 15 W. The photosensitive layer and polymerizable layer were pealed each other to find that a red sharp polymer image corresponding to the imagewise unexposed area was formed on the polyester film of the polymerizable layer.

EXAMPLE 2

Preparation of photosensitive layer

Example 1 was repeated but replacing 2 parts of 4-methoxy-1-naphthol used in Example 1 with 3 parts of 2,2'-methylenebis(4-methoxyphenol), to prepare photosensitive layer (2). The same polymerizable layer as the polymerizable layer (1) in Example 1 was used.

Image formation

A mask was superposed on the photosensitive layer (2), and then was exposed to light for 50 msec with a distance of 5 cm from a fluorescent lamp having a fluorescent peak at 405 nm and an electric power of 10 W, thereby forming an imagewise latent image. Then, the mask was removed, and the photosensitive layer (2) and polymerizable layer (1) were superposed each other so that the photosensitive layer and the polymerizable layer (1) may come into face-to-face contact, and then heated and pressed at 115° C. for 15 seconds to carry out the heat development to form a pattern of the reducing agent and oxidized product and simultaneously to perform the transfer of this pattern to the polymerizable layer (1). Next, the whole area of the polymerizable layer (1) was exposed to light area for 40 seconds with a distance of 2 cm from a fluorescent lamp having a fluorescent peak at 380 nm and an electric power of 15 W. The polymerizable layer (1) was etched with ethanol to find that a red sharp polymer image corresponding to the imagewise unexposed area was formed on the polyester film of the polymerizable layer (1).

EXAMPLE 3

Preparation of Photosensitive material

Example 1 was repeated but replacing 2 parts of 4-methoxy-1-naphthol used in Example 1 with 2.5 parts of 8-hydroquinoline, to prepare an emulsion and to prepare photosensitive layer (3) so as to give a dried film thickness of 3 to 4 μm.

Next, a composition as shown below was thoroughly stirred and mixed, and uniformly dispersed and dissolved to prepare a coating solution.

| | |
|---|---|
| Polyvinyl butyral | 60 parts |
| Trimethylolpropane triacrylate | 40 part |
| 2,4-Diethylthioxantone | 4 parts |
| Ethyl dimethylaminobenzoate | 3 parts |
| n-Butanol | 400 parts |

The resulting coating solution was coated on the photosensitive layer (3) so as to give a dried film thickness of 3 μm, and further thereon an aqueous polyvinyl alcohol solution was coated with a thickness of 2 μm, thus preparing photosensitive material (3) comprising the photosensitive layer (3) and laminated thereon the polymerizable layer (2).

Image formation

A mask was superposed on the photosensitive material (3), and then was exposed to light for 50 msec with a distance of 5 cm from a fluorescent lamp having a fluorescent peak at 405 nm and an electric power of 10 W, thereby forming an imagewise latent image. Then, the mask was removed, and the photosensitive material (3) was allowed to pass for 20 seconds through a heat developing machine regulated to 95° C., and further heated and pressed under conditions at 150° C. for 2 seconds to carry out the transfer of the reducing agent and oxidized product obtained by the heat development.

Next, the whole area of the photosensitive material (3) was exposed to light for 40 seconds with a distance of 2 cm from a fluorescent lamp having a fluorescent peak at 380 nm and an electric power of 15 W. The PVA layer on the surface of the photosensitive material (3) was removed by washing with water, and thereafter the photosensitive material (3) was sufficiently dried. A red toner was sprayed on the whole surface of the polymerized layer. As a result, since the area of the polymerized layer, corresponding to the imagewise exposed area, was not polymerized, and hence became sticky the toner was adhered, while since the area corresponding to the imagewise unexposed area was polymerized and hence did not become sticky, the toner was not adhered. Thus an imagewise sharp and red toner image was obtained.

EXAMPLE 4

Preparation of photosensitive layer

A composition as shown below was stirred with use of a homomixer at 5,000 rpm for 10 minutes to prepare an emulsion.

| | |
|---|---|
| Silver bromide | 1 part |
| Silver behenate | 5 parts |
| 4,4'-Dimethoxy-1,1'-dihydroxy-2,2'-binaphthyl | 1.8 parts |
| Behenic acid | 2 parts |
| Polyvinyl butyral (polymerization degree: 2,200) | 10 parts |
| Isopropanol | 40 parts |
| Methyl ethyl ketone | 40 parts |

The resulting emulsion was coated on a polyester film with use of an applicator so as to give a dried film thickness of 4 μm, to obtain photosensitive layer (4).

Preparation of polymerizable layer

A composition as shown below was thoroughly stirred, and uniformly dispersed and dissolved to prepare a coating solution.

| | |
|---|---|
| Methyl methacrylate/butyl methacrylate copolymer | 60 parts |
| Trimethylolpropane triacrylate | 40 parts |
| Dicumyl peroxide | 0.3 part |
| Permanent Red 4R | 12 parts |
| Methyl ethyl ketone | 400 parts |

This coating solution was coated on a polyester film with use of an applicator so as to give a dried film thickness of 3 μm to obtain polymerizable layer (3).

Image formation

A mask was superposed on the photosensitive layer (4), and then was exposed to light for 50 msec with a distance of 5 cm from a fluorescent lamp having a fluorescent peak at 405 nm and an electric power of 10 W, thereby forming an imagewise latent image. Next, the mask was removed, and the layer was allowed to pass for 20 seconds through a heat developing machine regulated to 95° C. to cause a oxidation-reduction reaction in the photosensitive layer. Thus, a silver image was imagewise formed in the latent image portion. Next, the resultant photosensitive layer (4) and polymerizable layer (3) were superposed each other so that the photosensitive and the polymerizable layer may come into face-to-face contact. The transfer of the reducing agent and oxidized product, or the oxidized product, and simultaneously the polymerization of the polymerizable layer were carried out at 140° C. and 2 seconds. The area coming into face-to-face contact with the imagewise exposed area was not polymerized, and the polymerizable layer adhered to the photosensitive layer and coming into face-to-face contact with the imagewise unexposed area were polymerized. Then the photosensitive layer (4) and polymerizable layer (3) were separated each other. As a result, the imagewise exposed area which was not polymerized was transferred to the photosensitive layer, and a polymerized red sharp image was obtained on the polymerizable layer.

EXAMPLE 5

Preparation of photosensitive layer

Example 1 was repeated but replacing 2 parts of 4-methoxy-1-naphthol used in Example 1 with 2.5 parts of 1-methoxy-5-hydroxyanthracene, to prepare an emulsion and to prepare photosensitive layer (5) so as to give a dried film thickness of 4 μm.

Image formation was carried out using the same polymerizable layer (1) as used in Example 1.

The same procedures were repeated except that the heating conditions (140° C. for 2 seconds) in the image formation in Example 1 were changed to 150° C. and 2 seconds. As a result, a red sharp polymer image corresponding to the imagewise unexposed area was formed on the polyester film of the polymerizable layer (1).

COMPARATIVE EXAMPLE 1

Preparation of photosensitive layer

A composition as shown below was dispersed with use of a homomixer at 5,000 rpm for 10 minutes to

| | |
|---|---|
| Silver bromide | 0.1 part |
| Silver behenate | 0.5 part |
| m-Dimethylaminophenol | 0.2 part |
| Behenic acid | 0.2 part |
| Methyl methacrylate/butyl methylacrylate copolymer | 60 parts |
| Trimethylolpropane triacrylate | 40 parts |
| Dicumyl peroxide | 0.8 part |
| Permanent Red 4R | 12 parts |
| Methyl ethyl ketone | 400 parts |

This emulsion was coated on a polyester film so as to give a dried film thickness of 6 μm, and a heat-resistant protective layer comprising polyvinyl alcohol was provided thereon with a thickness of 2 μm, thus obtaining a conventional photosensitive image forming material.

Image formation

A latent image was formed on the above photosensitive image forming material by the same procedures as Example 1, followed by heating with use of a heat developing machine at 120° C. for 30 seconds. At this stage, a silver image was formed in the latent image portion, and further the polymerization reaction took place at the same area, followed by etching to obtain a red polymer image, which, however, was a dull image with a poor chroma because of coexistence of the silver image and red image in the same area.

COMPARATIVE EXAMPLE 2

Preparation of Photosensitive layer

| | |
|---|---|
| Silver chlorobromide emulsion (containing 10% by weight of silver chlorobromide of a molar ratio of chlorine/bromine of 1/1) | 1.5 g |
| 10 wt % aqueous solution of gelatine | 2.2 g |
| Phenidone | 0.1 g |
| Triethanolamine | 0.1 g |
| Sorbitol | 0.2 g |
| 5 wt % aqueous solution of sodium p-dodecylbenzenesulfonate | 0.15 g |
| Water | 36.0 g |

A solution of the above described formulation was applied to a polyethylene terephthalate film so as to result in a dry film thickness of 1 μm, and dried to prepare a photosensitive layer. The amount of silver halide coated was 0.05 g/$m^2$ as silver.

Preparation of polymerizable layer

| | |
|---|---|
| Pentaerythritol tetraacrylate | 2 g |
| Methylene Blue | 0.007 g |
| Dimedone (1,1-dimethylcyclohexane-3,4-dione) | 0.2 g |
| Sorbitol | 0.5 g |
| 10 wt % aqueous solution of polyvinyl alcohol (average degree of polymerization about 500) | 10 g |
| 5 wt % aqueous solution of sodium p-dodecylbenzenesulfonate | 0.5 g |
| Phthalocyanin | 0.1 g |

A mixture of the above described formulation was emulsified by a ultrasonic emulsifier for 1 hour, and it was applied to a polyethylene terephthalate film so as to result in a dry film thickness of about 7 μm, and dried to prepare a polymerizable layer.

Image formation

A latent image was formed in a manner similar to that in Example 1. Next, the mask was removed, and the layer was passed for 15 seconds through a heat developing machine regulated to 110° C. The resultant photosensitive layer and polymerizable layer (1) were superposed each other and heated at 110° C. for 15 seconds, and the whole area of the polymerizable layer (1) was exposed for 30 seconds using a halogen lump at 50,000 luxes.

After two layers were separated, the polymerized layer was etched with a developing solution composed of 1 part of ethanol and 1 part of water fo find that a blue polymer image corresponding to the imagewise exposed area was formed. But, the obtained blue image was partly etched, so that its density was low and also the edge thereof was unclear, as compared with the image obtained according to the present invention.

We claim:

1. A photosensitive material, comprising a photosensitive layer containing a photosensitive and a heat-developable element and a polymerizable layer which are laminated, wherein said photosensitive and heat-developable element comprises at least a photosensitive silver halide, an organic silver salt and a reducing agent, said reducing agent being at least one of the compounds selected from the group of compounds having the following Formula (I), (II), (III), (IV), and (V):

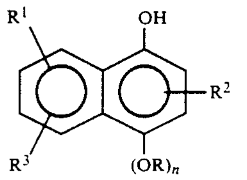

(I)

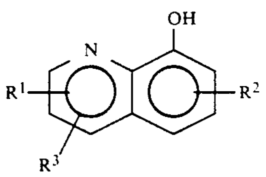

(II)

-continued (III)

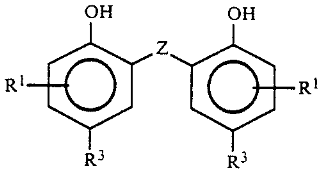

(IV)

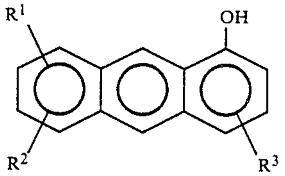

(V)

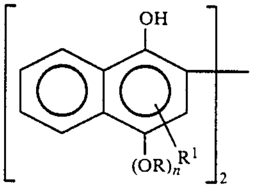

wherein R is a hydrogen atom, a substituted or unsubstituted alkyl group or a substituted or unsubstituted aralkyl group; $R^1$ and $R^2$ are each a hydrogen atom, a halogen atom, an alkoxy group, a substituted or unsubstituted alkyl group, a substituted or unsubstituted aryl group or a substituted or unsubstituted aralkyl group; $R^3$ is a hydrogen atom, a hydroxyl group or a substituted or unsubstituted alkyl group; n is an integer of 0 or 1; Z is a divalent linking group selected from the group consisting of an alkylidene group, an aralkylidene group or a sulfur atom; and when said photosensitive material is exposed to light with a wavelength of 400 to 900 nm and heated to 60° to 180° C., an area of said polymerizable layer, corresponding to an unexposed area of said photosensitive layer, is polymerized.

2. The photosensitive material according to claim 1, wherein said photosensitive silver halide is contained in an amount of from 0.1 to 100 parts by weight based on 100 parts by weight of said organic silver salt.

3. The photosensitive material according to claim 1, wherein said reducing agent is contained in an amount of from 0.5 to 3.0 mols per mol of said photosensitive silver halide and organic silver salt.

4. The photosensitive material according to claim 1, wherein said photosensitive layer has a thickness of from 0.1 $\mu m$ to 2 mm.

5. The photosensitive material according to claim 1, wherein said photosensitive material further comprises a support provided on its photosensitive layer side.

6. The photosensitive material according to claim 1, wherein said polymerizable layer contains at least a polymerizable polymer precursor and a thermopolymerization initiator.

7. The photosensitive material according to claim 6, wherein said thermopolymerization initiator is contained in an amount of from 0.1 to 50 parts by weight based on 100 parts by weight of said polymerizable polymer precursor.

8. The photosensitive material according to claim 1, wherein said polymerizable layer has a thickness of from 0.1 $\mu m$ to 2 mm.

9. The photosensitive material according to claim 1, wherein said photosensitive material further comprises a support provided on its polymerizable layer side.

10. The photosensitive material according to claim 1, wherein said photosensitive material further comprises supports provided respectively on its polymerizable layer side and photosensitive layer side.

11. A photosensitive material, comprising a photosensitive layer containing a photosensitive and a heat-developable element and a polymerizable layer which are laminated, wherein said photosensitive and heat-developable element comprises at least a photosensitive silver halide, an organic silver salt and a reducing agent, said reducing agent being at least one of the compounds selected from the group of compounds having the following Formula (I), (II), (III), (IV), and (V):

(I)

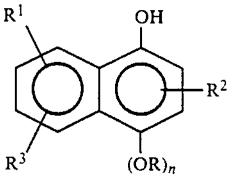

(II)

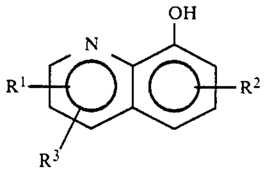

(III)

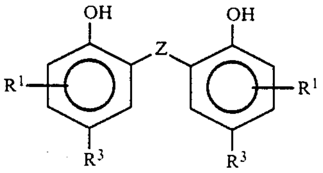

(IV)

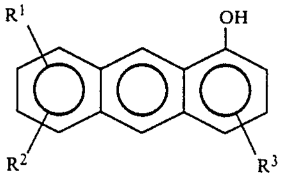

(V)

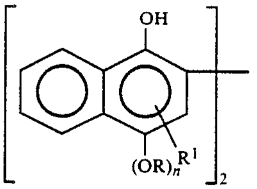

wherein R is a hydrogen atom, a substituted or unsubstituted alkyl group or a substituted or unsubstituted aralkyl group; $R^1$ and $R^2$ are each a hydrogen atom, a halogen atom, an alkoxy group, a substituted or unsubstituted alkyl group, a substituted or unsubstituted aryl group or a substituted or unsubstituted aralkyl group; $R^3$ is a hydrogen atom, a hydroxyl group or a substituted or unsubstituted alkyl group; n is an integer of 0 or 1; Z is a divalent linking group selected from the group consisting of an alkylidene group, an aralkylidene group or a sulfur atom; and when said photosensitive material is exposed to light with a wavelength of 400 to 900 nm and heated to 60° to 180° C. and exposed to light with a wavelength of from 250 to 700 nm, an area of said polymerizable layer, corresponding to an unexposed area of said photosensitive layer, is polymerized, said unexposed area being an area not exposed to light with a wavelength of 400 to 900 nm.

12. The photosensitive material according to claim 11, wherein said photosensitive silver halide is contained in an amount of from 0.1 to 100 parts by weight based on 100 parts by weight of said organic silver salt.

13. The photosensitive material according to claim 11, wherein said reducing agent is contained in an amount of from 0.5 to 3.0 mols per mol of said photosensitive silver halide and organic silver salt.

14. The photosensitive material according to claim 11, wherein said photosensitive layer has a thickness of from 0.1 μm to 2 mm.

15. The photosensitive material according to claim 11, wherein said photosensitive material further comprises a support provided on its photosensitive layer side.

16. The photosensitive material according to claim 11, wherein said polymerizable layer contains at least a polymerizable polymer precursor and a photopolymerization initiator.

17. The photosensitive material according to claim 16, wherein said photopolymerization initiator is contained in an amount of from 0.1 to 50 parts by weight based on 100 parts by weight of said polymerizable polymer precursor.

18. The photosensitive material according to claim 11, wherein said polymerizable layer has a thickness of from 0.1 μm to 2 mm.

19. The photosensitive material according to claim 11, wherein said photosensitive material further comprises a support provided on its polymerizable layer side.

20. The photosensitive material according to claim 11, wherein said photosensitive material further comprises supports provided respectively on its polymerizable layer side and photosensitive layer side.

21. An image forming method, comprising the steps of;

(a) subjecting to imagewise exposure of light with a wavelength of 400 to 900 nm a photosensitive material comprising a photosensitive layer containing a photosensitive and a heat-developable element and a polymerizable layer which are laminated, wherein said photosensitive and heat-developable element comprises at least a photosensitive silver halide, an organic silver salt and a reducing agent;

(b) heating said photosensitive material to form a metallic silver and an oxidized product of said reducing agent capable of inhibiting polymerization on an exposed area of said photosensitive layer and to provide an unexposed area of said photosensitive layer containing unreacted silver halide and said reducing agent, and further to transfer said oxidized product to said polymerizable layer; and (c) polymerizing an area of said polymerizable layer, which area corresponds to said unexposed area of the photosensitive layer of said photosensitive material, whereby an area of said polymerizable layer corresponding to said exposed area of said photosensitive layer is inhibited against polymerization by said oxidized product of said reducing agent.

22. The image forming method according to claim 21, wherein said heating step is the step of heating the photosensitive material to a temperature of from 60° to 180° C.

23. The image forming method according to claim 21, wherein said heating step comprises a first heating step to heat the photosensitive material to a temperature of from 60° to 150° C. and a second heating step to heat the photosensitive material to a temperature of from 70° to 180° C.

24. The image forming method according to claim 21, wherein said polymerizing step is the step of heating the polymerizable layer to a temperature at which the layer can be polymerized.

25. The image forming method according to claim 21, wherein said polymerizing step is the step of exposing the polymerizable layer to light which can polymerize the layer.

26. The image forming method according to claim 24, wherein said polymerizing step is the step of heating the polymerizable layer to a temperature at which the layer can be polymerized after separating the photosensitive layer from the polymerizable layer.

27. The image forming method according to claim 25, wherein said polymerizing step is the step of exposing the polymerizable layer to light which can polymerize the layer after separating the photosensitive layer from the polymerizable layer.

28. An image forming method according to claim 21, wherein said reducing agent includes at least one of the compounds selected from the group consisting of compounds of the following Formula (I), (II), (III), (IV), and (V):

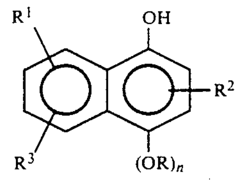
(I)

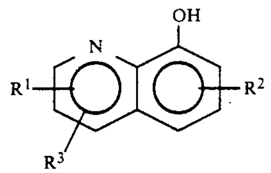
(II)

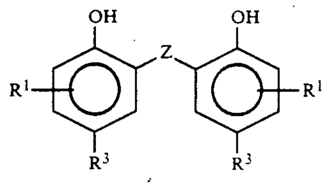
(III)

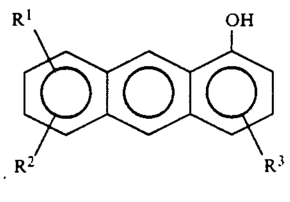
(IV)

-continued

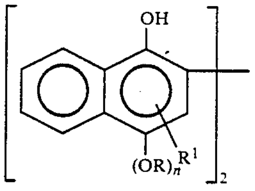
(V)

wherein R is a hydrogen atom, a substituted or unsubstituted alkyl group or a substituted or unsubstituted aralkyl group; $R^1$ and $R^2$ are each a hydrogen atom, a halogen atom, an alkoxy group, a substituted or unsubstituted alkyl group, a substituted or unsubstituted aryl group or a substituted or unsubstituted aralkyl group; $R^3$ is a hydrogen atom, a hydroxyl group or a substituted or unsubstituted alkyl group; n is an integer of 0 or 1; z is a divalent linking group selected from the group consisting of an alkylidene group, an aralkylidene group or a sulfur atom.

29. An image forming method, comprising the steps of;

(a) subjecting a photosensitive layer containing a photosensitive and a heat-developable element, wherein said photosensitive and heat-developable element comprises at least a photosensitive silver halide, an organic silver salt and a reducing agent to imagewise exposure of light with a wavelength of 400 to 900 nm;

(b) heating the laminated material after laminating a polymerizable layer on said photosensitive layer to form a metallic silver and an oxidized product of said reducing agent capable of inhibiting polymerization on an exposed area of said photosensitive layer and to provide an unexposed area of said photosensitive layer containing unreacted silver halide and said reducing agent, and further to transfer said oxidized product to said polymerizable layer; and (c) polymerizing an area of said polymerizable layer, which area corresponds to said unexposed area of the photosensitive layer of said photosensitive material, whereby an area of said polymerizable layer corresponding to said exposed area of said photosensitive layer is inhibited against polymerization by said oxidized product of said reducing agent.

30. The image forming method according to claim 29, wherein said heating step is the step of heating the photosensitive material to a temperature of from 60° to 180° C.

31. The image forming method according to claim 29, wherein said heating step comprises a first heating step to heat the photosensitive material to a temperature of from 60° to 150° C. and a second heating step to heat the photosensitive material to a temperature of from 70° to 180° C.

32. The image forming method according to claim 29, wherein said polymerizing step is the step of heating the polymerizable layer to a temperature at which the layer can be polymerized.

33. The image forming method according to claim 29, wherein said polymerizing step is the step of exposing the polymerizable layer to light which can polymerize the layer.

34. The image forming method according to claim 32, wherein said polymerizing step is the step of heating the polymerizable layer to a temperature at which the layer can be polymerized after separating the photosensitive layer from the polymerizable layer.

35. The image forming method according to claim 33, wherein said polymerizing step is the step of exposing the polymerizable layer to light which can polymerize the layer after separating the photosensitive layer from the polymerizable layer.

36. An image forming method according to claim 29, wherein said reducing agent includes at least one of the compounds selected from the group consisting of compounds of the following Formula (I), (II), (III), (IV), and (V):

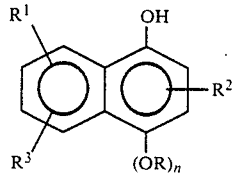
(I)

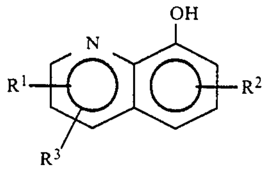
(II)

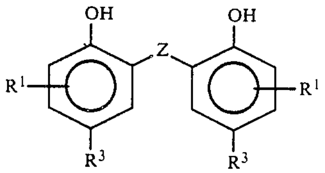
(III)

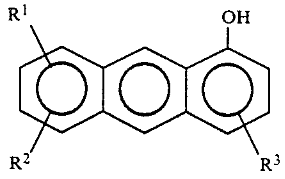
(IV)

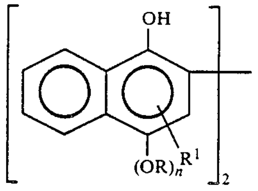
(V)

wherein R is a hydrogen atom, a substituted or unsubstituted alkyl group or a substituted or unsubstituted aralkyl group; $R^1$ and $R^2$ are each a hydrogen atom, a halogen atom, an alkoxy group, a substituted or unsubstituted alkyl group, a substituted or unsubstituted aryl group or a substituted or unsubstituted aralkyl group; $R^3$ is a hydrogen atom, a hydroxyl group or a substituted or unsubstituted alkyl group; n is an integer of 0 or 1; Z is a divalent linking group selected from the group consisting of an alkylidene group, an aralkylidene group or a sulfur atom.

37. An image forming method, comprising the steps of;

(a) subjecting a photosensitive layer containing a photosensitive and a heat-developable element, wherein said photosensitive and heat-developable element comprises at least a photosensitive silver halide, an organic silver salt and a reducing agent to imagewise exposure of light with a wavelength of 400 to 900 nm;

(b) heating said photosensitive layer to form a metallic silver and an oxidized product of said reducing agent capable of inhibiting polymerization on an exposed area of said photosensitive layer and to provide an unexposed area of said photosensitive layer containing unreacted silver halide and said reducing agent; and (c) polymerizing an area in a polymerizable layer, which area corresponds to said unexposed area in the photosensitive layer, after laminating a polymerizable layer on said photosensitive layer and transferring said oxidized product to said polymerizable layer, whereby an area of said polymerizable layer corresponding to said exposed area of said photosensitive layer is inhibited against polymerization by said oxidized product of said reducing agent.

38. The image forming method according to claim 37, wherein said heating step is the step of heating the photosensitive layer to a temperature of from 60° to 150° C.

39. The image forming method according to claim 37, wherein said polymerizing step is the step of heating the laminated material to a temperature of from 70° to 180° C.

40. An image forming method according to claim 37, wherein said reducing agent includes at least one of the compounds selected from the group consisting of compounds of the following Formula (I), (II), (III), (IV), and (V):

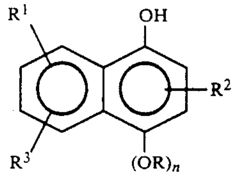
(I)

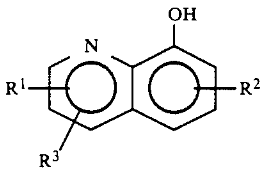
(II)

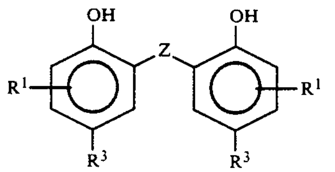
(III)

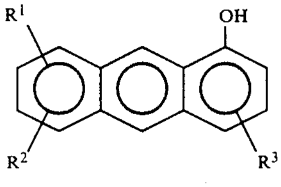
(IV)

-continued

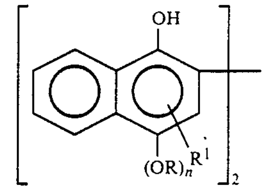
(V)

wherein R is a hydrogen atom, a substituted or unsubstituted alkyl group or a substituted or unsubstituted aralkyl group; $R^1$ and $R^2$ are each a hydrogen atom, a halogen atom, an alkoxy group, a substituted or unsubstituted alkyl group, a substituted or unsubstituted aryl group or a substituted or unsubstituted aralkyl group; $R^3$ is a hydrogen atom, a hydroxyl group or a substituted or unsubstituted alkyl group; n is an integer of 0 or 1; Z is a divalent linking group selected from the group consisting of an alkylidene group, an aralkylidene group or a sulfur atom.

41. An image forming method, comprising the steps of:

(a) subjecting a photosensitive layer containing a photosensitive and a heat-developable element, wherein said photosensitive and heat-developable element comprises at least a photosensitive silver halide, an organic silver salt and a reducing agent to imagewise exposure of light with a wavelength of 400 to 900 nm;

(b) heating said photosensitive layer to form a metallic silver and an oxidized product of said reducing agent capable of inhibiting polymerization on an exposed area of said photosensitive layer and to provide an unexposed area of said photosensitive layer containing unreacted silver halide and said reducing agent;

(c) laminating a polymerizable layer on said photosensitive layer, and then heating the laminated material to transfer said oxidized product to said polymerizable layer; and (d) polymerizing an area of said polymerizable layer, which area corresponds to said unexposed area of the photosensitive layer of said laminated material, whereby an area of said polymerizable layer corresponding to said exposed area of said photosensitive layer is inhibited against polymerization by said oxidized product of said reducing agent.

42. The image forming method according to claim 41, wherein said step of heating the photosensitive layer is the step of heating the photosensitive layer to a temperature of from 60° to 150° C.

43. The image forming method according to claim 41, wherein said step of heating the laminated material is the step of heating the laminated material to a temperature of from 70° to 180° C.

44. The image forming method according to claim 41, wherein said polymerizing step is the step of heating the polymerizable layer to a temperature at which the layer can be polymerized.

45. The image forming method according to claim 41, wherein said polymerizing step is the step of exposing the polymerizable layer to light which can polymerize the layer.

46. The image forming method according to claim 44, wherein said polymerizing step is the step of heating the polymerizable layer to a temperature at which the layer can be polymerized after separating the photosensitive layer from the polymerizable layer.

47. The image forming method according to claim 45, wherein said polymerizing step is the step of exposing the polymerizable layer to light which can polymerize the layer after separating the photosensitive layer from the polymerizable layer.

48. An image forming method according to claim 41, wherein said reducing agent includes at least one of the compounds selected from the group consisting of compounds of the following Formula (I), (II), (III), (IV), and (V):

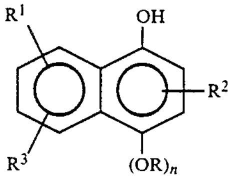
(I)

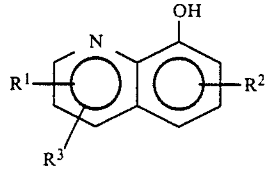
(II)

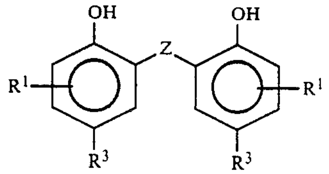
(III)

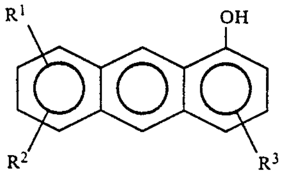
(IV)

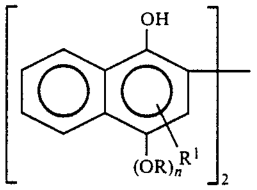
(V)

wherein R is a hydrogen atom, a substituted or unsubstituted alkyl group or a substituted or unsubstituted aralkyl group; $R^1$ and $R^2$ are each a hydrogen atom, a halogen atom, an alkoxy group, a substituted or unsubstituted alkyl group, a substituted or unsubstituted aryl group or a substituted or unsubstituted aralkyl group; $R^3$ is a hydrogen atom, a hydroxyl group or a substituted or unsubstituted alkyl group; n is an integer of 0 or 1; Z is a divalent linking group selected from the group consisting of alkylidene group, an aralkylidene group or a sulfur atom.

49. An image forming method, comprising the steps of;

(a) subjecting to imagewise exposure of light with a wavelength of 400 to 900 nm a photosensitive material comprising a photosensitive layer containing a photosensitive and a heat-developable element, wherein said photosensitive and heat-developable element comprises at least a photosensitive silver halide, an organic silver salt and a reducing agent and a polymerizable layer which are laminated;

(b) heating said photosensitive material to form a metallic silver and an oxidized product of said reducing agent capable of inhibiting polymerization on an exposed area of said photosensitive layer and to provide an unexposed area of said photosensitive layer containing unreacted silver halide and said reducing agent, and further to transfer said oxidized product to said polymerizable layer; and (c) polymerizing an area of said polymerizable layer, which area corresponds to said unexposed area of the photosensitive layer of said photosensitive material, whereby an area of said polymerizable layer corresponding to said exposed area of said photosensitive layer is inhibited against polymerization by said oxidized product of said reducing agent, to form a positive image and a negative image with respect to said image exposure.

50. The image forming method according to claim 49, wherein said heating step is the step of heating the photosensitive material to a temperature of from 60° to 180° C.

51. The image forming method according to claim 49, wherein said heating step comprises a first heating step to heat the photosensitive material to a temperature of from 60° to 150° C. and a second heating step to heat the photosensitive material to a temperature of from 70° to 180° C.

52. The image forming method according to claim 49, wherein said polymerizing step is the step of heating the polymerizable layer to a temperature at which the layer can be polymerized.

53. The image forming method according to claim 49, wherein said polymerizing step is the step of exposing the polymerizable layer to light which can polymerize the layer.

54. The image forming method according to claim 52, wherein said polymerizing step is the step of heating the polymerizable layer to a temperature at which the layer can be polymerized after separating the photosensitive layer from the polymerizable layer.

55. The image forming method according to claim 53, wherein said polymerizing step is the step of exposing the polymerizable layer to light which can polymerize the layer after separating the photosensitive layer from the polymerizable layer.

56. An image forming method according to claim 49, wherein said reducing agent includes at least one of the compounds selected from the group consisting of the following Formula (I), (II), (III), (IV), and (V):

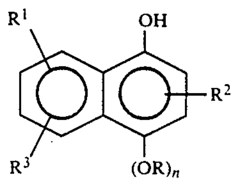
(I)

-continued (II)

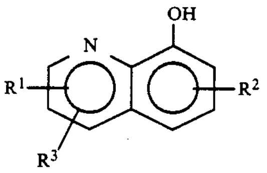

(III)

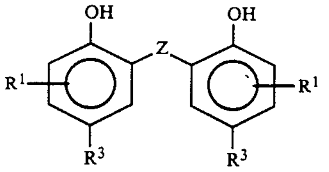

-continued (IV)

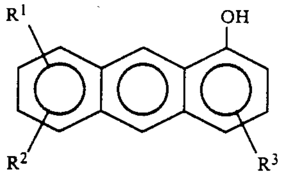

(V)

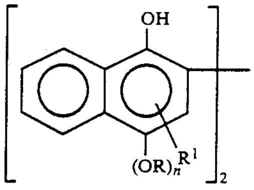

wherein R is a hydrogen atom, a substituted or unsubstituted alkyl group or a substituted or unsubstituted aralkyl group; $R^1$ and $R^2$ are each a hydrogen atom, a halogen atom, an alkoxy group, a substituted or unsubstituted alkyl group, a substituted or unsubstituted aryl group or a substituted or unsubstituted aralkyl group; $R^3$ is a hydrogen atom, a hydroxyl group or a substituted or unsubstituted alkyl group; n is an integer of 0 or 1; Z is a divälent linking group selected from the group consisting of alkylidene group, an aralkylidene group or a sulfur atom.

* * * * *